(12) United States Patent
Ofoma et al.

(10) Patent No.: US 10,638,644 B2
(45) Date of Patent: Apr. 28, 2020

(54) THERMAL MANAGEMENT SYSTEM FOR AN AIRCRAFT AVIONICS BAY

(71) Applicant: AeroVironment Inc., Monrovia, CA (US)

(72) Inventors: Uchenna Ofoma, San Gabriel, CA (US); Bart Dean Hibbs, Simi Valley, CA (US)

(73) Assignee: AeroVironment Inc., Monrovia, CA (US)

( * ) Notice: Subject to any disclaimer, the term of this patent is extended or adjusted under 35 U.S.C. 154(b) by 15 days.

(21) Appl. No.: 16/130,862

(22) Filed: Sep. 13, 2018

(65) Prior Publication Data

US 2019/0014691 A1  Jan. 10, 2019

Related U.S. Application Data

(63) Continuation of application No. 15/693,898, filed on Sep. 1, 2017, now Pat. No. 10,104,809, which is a (Continued)

(51) Int. Cl.
*H05K 7/20* (2006.01)
*H01L 23/36* (2006.01)
(Continued)

(52) U.S. Cl.
CPC ......... *H05K 7/20445* (2013.01); *H01L 23/36* (2013.01); *B64D 2013/0614* (2013.01);
(Continued)

(58) Field of Classification Search
CPC .......... H05K 7/20445; H05K 7/20509; H05K 9/0015; H01L 23/26; H01L 23/36; H01L 23/3672; B64D 2013/0614; F28F 13/003
See application file for complete search history.

(56) References Cited

U.S. PATENT DOCUMENTS

| 1,427,941 A | 9/1922 | Blenio |
| 2,886,514 A | 1/1959 | Hodson et al. |
| (Continued) | | |

FOREIGN PATENT DOCUMENTS

| DE | 19630002 A1 | 2/1997 |
| EP | 0297793 A2 | 1/1969 |
| (Continued) | | |

OTHER PUBLICATIONS

U.S. Appl. No. 15/693,698, filed Sep. 1, 2017, Notice of Allowance dated Jun. 18, 2018 (15 pgs.).
(Continued)

*Primary Examiner* — Jacob R Crum
(74) *Attorney, Agent, or Firm* — Brinks Gilson & Lione

(57) ABSTRACT

A system for managing heat transfer is provided by the present disclosure, which in one form includes a cavity having an inner wall portion, at least one heat-generating component disposed within the cavity, and a plurality of heat conducting members disposed adjacent one another. Each heat conducting member includes a resilient core and an outer shell wrapped around at least a portion of the resilient core. The outer shell is made of a material having a relatively high thermal conductivity, and the plurality of heat conducting members are positioned between the heat-generating component and the inner wall portion of the cavity.

15 Claims, 12 Drawing Sheets

Atmosphere

Related U.S. Application Data continuation of application No. 13/220,329, filed on Aug. 29, 2011, now Pat. No. 9,756,764.

(51) Int. Cl.
  *F28F 13/00* (2006.01)
  *H01L 23/367* (2006.01)
  *B64D 13/06* (2006.01)

(52) U.S. Cl.
  CPC ......... *F28F 13/003* (2013.01); *H01L 23/3672* (2013.01); *H01L 2924/0002* (2013.01); *H05K 7/20509* (2013.01)

(56) References Cited

U.S. PATENT DOCUMENTS

| | | |
|---|---|---|
| 3,020,986 A | 2/1962 | Kirk et al. |
| 3,067,594 A | 12/1962 | Bland et al. |
| 3,126,718 A | 3/1964 | Flamand |
| 3,538,719 A | 11/1970 | Pradel |
| 3,597,891 A | 8/1971 | Martin |
| 3,867,244 A | 2/1975 | Adams |
| 4,139,670 A | 2/1979 | Fehlmann |
| 4,141,338 A | 2/1979 | Lof |
| 4,306,616 A | 12/1981 | Woods, Jr. et al. |
| 4,478,277 A | 10/1984 | Friedman et al. |
| 4,612,601 A | 9/1986 | Watari |
| 4,726,707 A | 2/1988 | Newton |
| 4,777,561 A | 10/1988 | Murphy et al. |
| 4,838,347 A | 6/1989 | Dentini |
| 4,925,134 A | 5/1990 | Keller et al. |
| 5,053,265 A | 10/1991 | Alexander |
| 5,175,613 A | 12/1992 | Barker, III et al. |
| 5,315,480 A | 5/1994 | Samarov et al. |
| 5,471,366 A | 11/1995 | Ozawa |
| 5,810,284 A | 9/1998 | Hibbs et al. |
| 5,821,612 A | 10/1998 | Kitagawa |
| 6,148,586 A | 11/2000 | Jandl |
| 6,166,908 A | 12/2000 | Samaras et al. |
| 6,211,494 B1 * | 4/2001 | Giamati ............... B64C 1/1453 219/201 |
| 6,653,556 B2 | 11/2003 | Kim |
| 6,746,755 B2 | 6/2004 | Morrison et al. |
| 7,093,649 B2 | 8/2006 | Dawson |
| 7,284,600 B2 | 10/2007 | Thoman |
| 7,320,361 B2 | 1/2008 | Arai et al. |
| 7,470,866 B2 | 12/2008 | Dietrich et al. |
| 7,492,599 B1 | 2/2009 | Yu et al. |
| 7,995,344 B2 | 8/2011 | Dando et al. |
| 8,490,365 B2 | 7/2013 | Mueller et al. |
| 8,995,131 B2 | 3/2015 | Ofoma |
| 9,010,054 B2 | 4/2015 | Herdt |
| 9,067,287 B2 | 6/2015 | Ofoma |
| 2001/0002528 A1 | 6/2001 | Fust, III |
| 2002/0172010 A1 | 11/2002 | Sarno et al. |
| 2003/0002296 A1 * | 1/2003 | Steiner ............... G02B 6/0006 362/560 |
| 2003/0059581 A1 | 3/2003 | Whalen |
| 2003/0136551 A1 | 7/2003 | Bakke |
| 2005/0017350 A1 | 1/2005 | Corti et al. |
| 2005/0263273 A1 | 12/2005 | Crumly |
| 2006/0035069 A1 | 2/2006 | Hanai |
| 2006/0083617 A1 * | 4/2006 | Jolly ............... B64C 27/001 416/133 |
| 2006/0234056 A1 | 10/2006 | Huang et al. |
| 2006/0269720 A1 | 11/2006 | Guanci |
| 2007/0041160 A1 | 2/2007 | Kehret et al. |
| 2007/0156289 A1 * | 7/2007 | Altieri ............... G01M 1/22 700/280 |
| 2007/0284737 A1 | 12/2007 | Too et al. |
| 2008/0196869 A1 | 8/2008 | Behrens et al. |
| 2009/0159751 A1 | 6/2009 | Wittmer |
| 2009/0288814 A1 | 11/2009 | Stoia et al. |
| 2010/0031599 A1 | 2/2010 | Kennedy et al. |
| 2010/0086746 A1 | 4/2010 | Kersnick et al. |
| 2010/0263846 A1 | 10/2010 | Dietz et al. |
| 2010/0319892 A1 | 12/2010 | Majette |
| 2010/0326645 A1 | 12/2010 | Fan |
| 2011/0018126 A1 | 1/2011 | Kling et al. |
| 2011/0232881 A1 | 9/2011 | Downing |
| 2012/0038849 A1 | 2/2012 | Dunn et al. |
| 2012/0125582 A1 | 5/2012 | Hansen |
| 2013/0047435 A1 | 2/2013 | Ofoma et al. |
| 2013/0048262 A1 | 2/2013 | Ofoma et al. |

FOREIGN PATENT DOCUMENTS

| | | |
|---|---|---|
| EP | 0537965 A2 | 4/1993 |
| WO | WO 01/49092 A1 | 7/2001 |
| WO | WO 2013/026045 | 2/2013 |

OTHER PUBLICATIONS

U.S. Appl. No. 14/721,527, filed May 26, 2015, Office Action dated Mar. 26, 2018 (15 pgs.).
U.S. Appl. No. 13/220,329, filed Aug. 29, 2011 Notice of Allowance dated Jul. 27, 2017 (9 pgs.).
U.S. Appl. No. 14/630,819, filed Feb. 25, 2015, Notice of Allowance dated Jul. 14, 2017 (5 pgs.).
U.S. Appl. No. 14/721,527, filed May 26, 2015, Office Action dated May 22, 2017 (11 pgs.).
U.S. Appl. No. 14/630,819, filed Feb. 25, 2015, Notice of Allowance dated Apr. 28, 2017 (5pgs.).
U.S. Appl. No. 13/220,329, filed Aug. 29, 2011, Patent Board Decision dated Apr. 19, 2017 (17 pgs.).
U.S. Appl. No. 14/630,819, filed Feb. 25, 2016, Corrected Notice of Allowance dated Jan. 13, 2017 (2 pgs.).
U.S. Appl. No. 14/630,819, filed Feb. 25, 2015, Notice of Allowance dated Dec. 21, 2016 (8 pgs.).
U.S. Appl. No. 14/721,527, filed May 26, 2015, Office Action dated Dec. 12, 2016 (11 pgs.).
U.S. Appl. No. 14/721,527, filed May 26, 2015, Office Action dated Sep. 6, 2016 (10 pgs.).
U.S. Appl. No. 14/630,819, filed Feb. 25, 2015, Office Action dated Aug. 11, 2016 (11 pgs.).
U.S. Appl. No. 14/721,527, filed May 26, 2015, Office Action dated Mar. 24, 2016 (13 pgs.).
U.S. Appl. No. 13/220,329, filed Aug. 29, 2011, Examiner's Answer to Appeal Brief dated Aug. 19, 2015 (15 pgs.).
U.S. Appl. No. 13/220,343, filed Aug. 29, 2011, Notice of Allowance dated Feb. 24, 2015 (26 pgs.).
U.S. Appl. No. 13/220,338, filed Aug. 29, 2011, Notice of Allowance dated Nov. 26, 2014 (16 pgs.).
U.S. Appl. No. 13/220,343, filed Aug. 29, 2011, Office Action dated Sep. 12, 2014 (11 pgs.).
U.S. Appl. No. 13/220,329, filed Aug. 29, 2011, Office Action dated, Aug. 13, 2014 (25 pgs.).
U.S. Appl. No. 13/220,338, filed Aug. 29, 2011, Office Action dated Jun. 4, 2014 (12 pgs.).
U.S. Appl. No. 13/220,343, filed Aug. 29, 2011, Office Action dated Apr. 8, 2014 (6 pgs.).
PCT/US2012/051494 International filing date: Aug. 17, 2012, International Preliminary Report on Patentability Chapter I dated Mar. 4, 2014 (13 pgs.).
U.S. Appl. No. 13/220,329, filed Aug. 29, 2011, Office Action dated Feb. 18, 2014 (22 pgs.).
PCT/2012/051496 International Filing Date: Aug. 17, 2012, PCT International Written Opinion of the International Searching Authority, dated Feb. 28, 2014, (6 pgs.).
U.S. Appl. No. 13/220,338, filed Aug. 29, 2011, Office Action dated Jan. 28, 2014 (10 pgs.).
PCT/2012/051499 International Filing Date: Aug. 17, 2012, PCT International Search Report and Written Opinion of the International Searching Authority, dated Dec. 20, 2012 (10 pgs.).
PCT/2012/051496 International Filing Date: Aug. 17, 2012, PCT International Search Report and Written Opinion of the International Searching Authority, dated Dec. 13, 2012 (11 pgs.).

(56) References Cited

OTHER PUBLICATIONS

PCT/2012/051496 International Filing Date: Aug. 17, 2012, PCT International Search Report of the International Searching Authority, dated Mar. 7, 2013 (5 pgs.).

* cited by examiner

THERMAL MANAGEMENT SYSTEM FOR AN AIRCRAFT AVIONICS BAY

PRIORITY CLAIM

The present patent document is a continuation of, and claims the benefit of priority from, U.S. patent application Ser. No. 13/220,329, filed Aug. 29, 2011, now U.S. Pat. No. 9,756,764, and U.S. patent application Ser. No. 15/693,898, now U.S. Pat. No. 10,104,809, which are hereby incorporated by reference.

FIELD

The present disclosure relates to avionics or equipment bays for aircraft, and in particular, systems for managing heat to improve cooling of electronics within the bays.

BACKGROUND

The statements in this section merely provide background information related to the present disclosure and may not constitute prior art.

Most aircraft, or air vehicles, typically include a number of bays that house a variety of equipment, such as avionics, batteries, diagnostic equipment, and servicing ports, among others. These bays extend into the interior of the aircraft to define a cavity, and are covered by removable doors or access panels so that the aircraft can maintain a smooth outer moldline surface for aerodynamic performance.

During operation, certain components located within these equipment bays can reach high temperatures, which can cause premature failure, and thus a means to provide cooling to these components is often provided. Typical methods may include integrated fans or cooling ducts, in addition to vents or louvers that allow airflow to enter the equipment bays during flight. Some equipment bays, however, are required to be sealed from moisture intrusion during operations, which limits certain cooling options, such as the vents or louvers. Accordingly, sealed equipment bays that include heat generating components, such as electronic components on printed circuit boards, or batteries, present a challenge in providing the requisite cooling to prevent premature equipment failure.

SUMMARY

In one form of the present disclosure, a system for managing heat transfer is provided that comprises a cavity having an inner wall portion, at least one heat-generating component disposed within the cavity, and a plurality of heat conducting members disposed adjacent one another. Each heat conducting member comprises a resilient core and an outer shell wrapped around at least a portion of the resilient core. The outer shell comprises a material having a relatively high thermal conductivity, wherein the plurality of heat conducting members are positioned between the heat-generating component and the inner wall portion of the cavity.

In another form, a system for managing heat transfer is provided that comprises a sealed cavity having an inner wall portion and at least one heat-generating component disposed within the sealed cavity. A plurality of heat conducting members are disposed adjacent one another, each heat conducting member comprising a thermally conductive resilient core and an outer shell wrapped around the resilient core. The outer shell comprises a pyrolytic graphite sheet (PGS) material, and the plurality of heat conducting members are positioned between the heat-generating component and the inner wall portion of the sealed cavity. A copper layer is disposed over the heat conducting members proximate the inner wall portion, and a pressure-sensitive adhesive (PSA) layer is disposed over the copper layer and in contact with the inner wall portion to secure the heat conducting members and the copper layer to the sealed cavity. Furthermore, at least one thermally conductive element is disposed between the heat conducting members and the heat-generating component.

In still another form, a system for managing heat transfer is provided that comprises a plurality of heat conducting members disposed adjacent one another, each heat conducting member comprising a thermally conductive resilient core and an outer shell wrapped around at least a portion of the resilient core. The outer shell comprises a material having a relatively high thermal conductivity, and the plurality of heat conducting members are adapted to be positioned proximate a heat-generating component to transfer heat away from the heat-generating component.

Further yet, a system for managing heat transfer is provided that comprises a plurality of heat conducting members disposed adjacent one another, each heat conducting member comprising a thermally conductive resilient core and an outer shell wrapped around the resilient core. The outer shell comprises a pyrolytic graphite sheet (PGS) material, and the plurality of heat conducting members are adapted to be positioned proximate a heat-generating component to transfer heat away from the heat-generating component.

According to another form of the present disclosure, a system for managing heat transfer is provided that comprises a cavity having an inner wall portion, at least one heat-generating component disposed within the cavity, and a plurality of heat conducting members disposed adjacent one another. Each heat conducting member comprises a resilient core and an outer shell wrapped around at least a portion of the resilient core, the outer shell comprising a material having a relatively high thermal conductivity. The plurality of heat conducting members are positioned between the heat-generating component and the inner wall portion of the cavity. A structural member is disposed proximate the inner wall portion of the cavity and comprises an upper skin, a lower skin, and a foam core disposed between the upper skin and the lower skin. At least one heat conducting member extends through the foam core and between the upper skin and the lower skin, the heat conducting member defining at least one upper cap, at least one lower cap, and a wall portion extending between the upper cap and the lower cap, the upper cap being disposed proximate a heat source. Furthermore, a heat conducting spreader is disposed between the lower cap of the heat conducting member and the lower skin of the structural member.

According to yet another form, a system for managing heat transfer is provided that comprises a cavity having an inner wall portion, at least one heat-generating component disposed within the cavity, and a plurality of heat conducting members disposed adjacent one another. Each heat conducting member comprises a resilient core and an outer shell wrapped around at least a portion of the resilient core, the outer shell comprising a material having a relatively high thermal conductivity. The plurality of heat conducting members are positioned between the heat-generating component and the inner wall portion of the cavity. A structural member is disposed proximate the inner wall portion of the cavity and comprises an upper skin, a lower skin, and a foam core disposed between the upper skin and the lower skin. At least one heat conducting member extends through the foam core and between the upper skin and the lower skin, the heat conducting member defining at least one upper cap, at least one lower cap, and a wall portion extending between the upper cap and the lower cap. The wall portion defines a perforated portion, and the upper cap is disposed proximate a heat source. A heat conducting spreader is disposed between the lower cap of the heat conducting member and the lower skin of the structural member. During manufacture, the foam core flows through the perforated portion during forming of the structural member.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
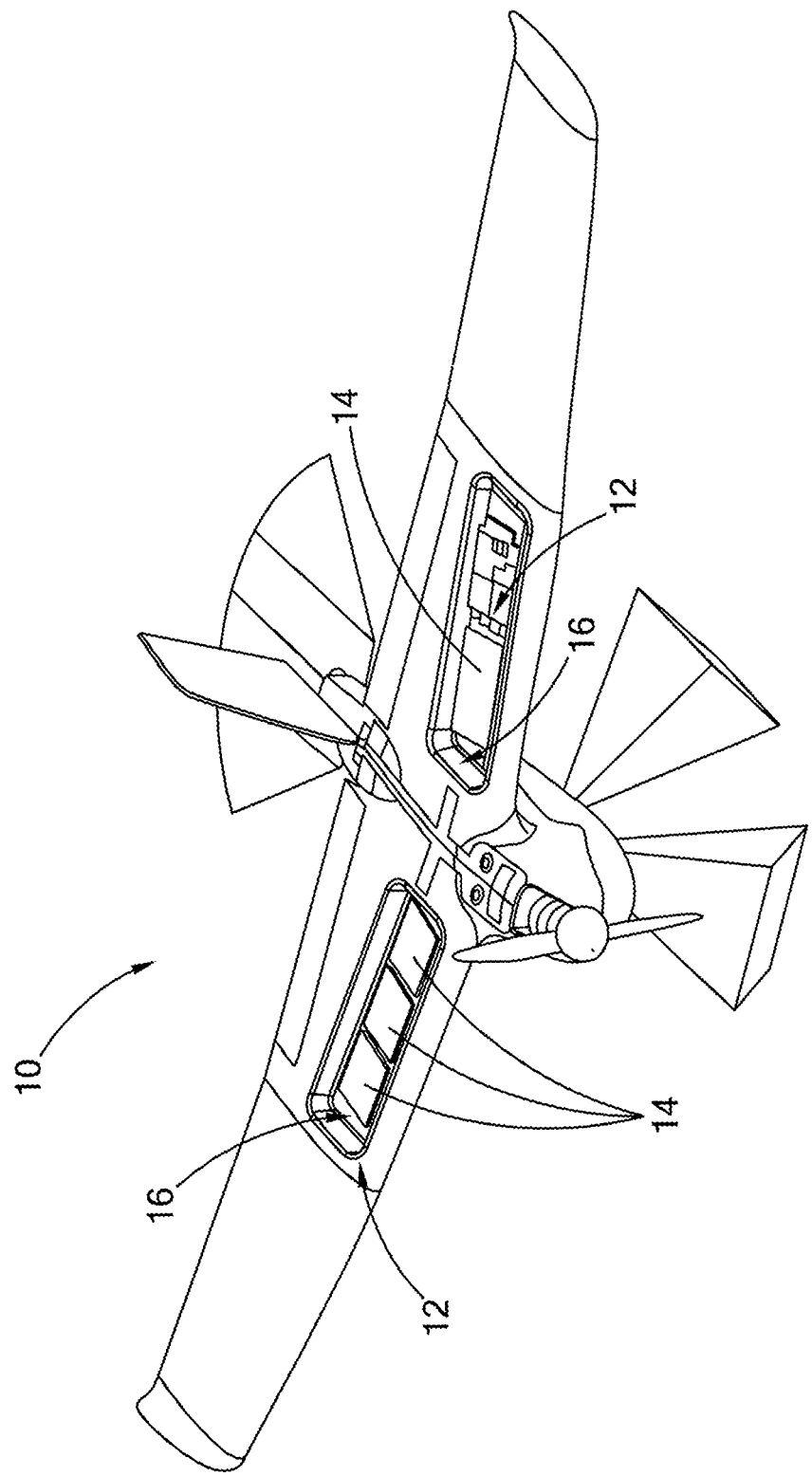
FIG. 1 is a perspective view of an exemplary air vehicle illustrating various equipment bays in which the principles of the present disclosure are applied.
Figure 2:
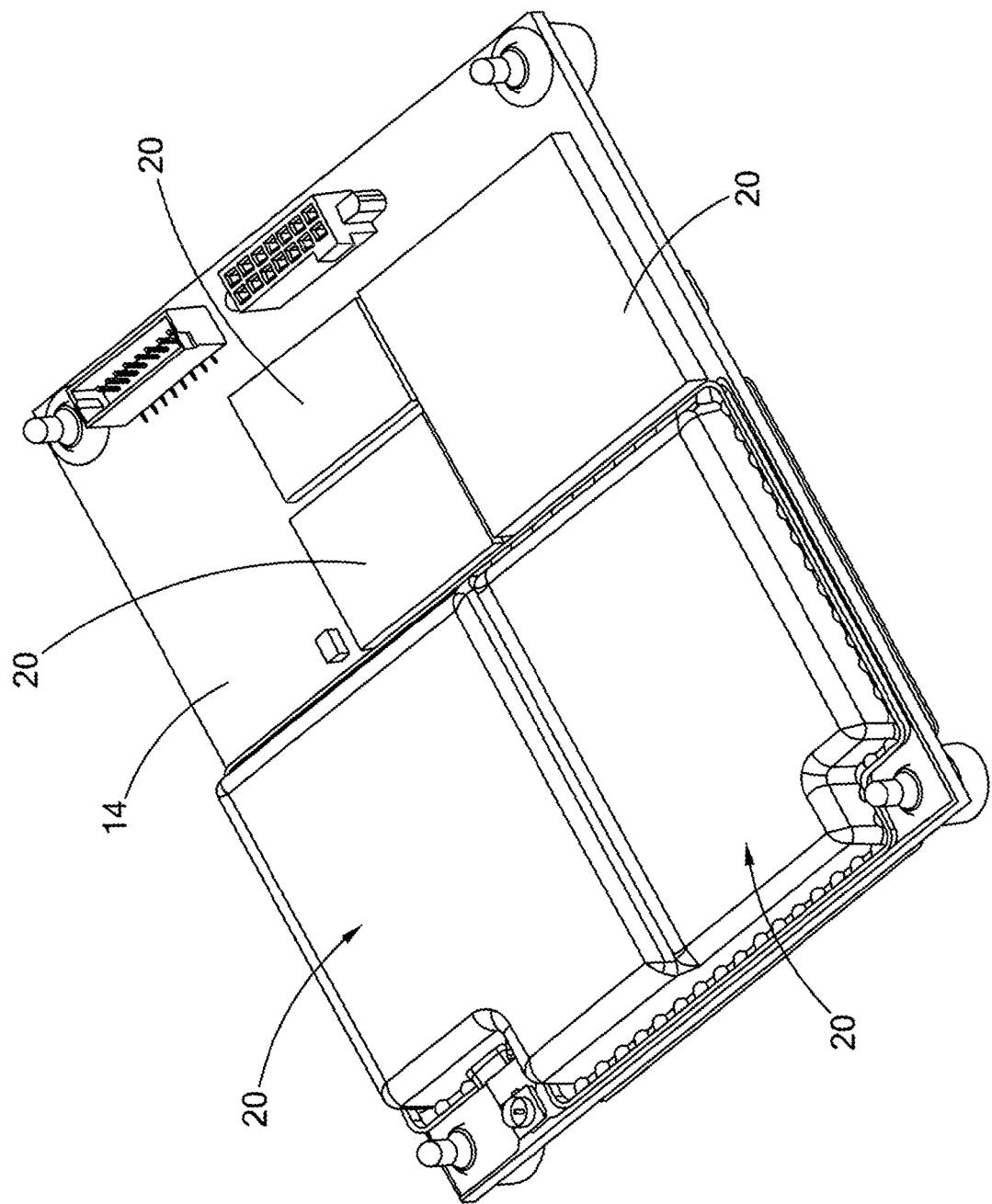
FIG. 2 is a top perspective view of one form of a system for managing heat transfer constructed in accordance with the principles of the present disclosure.

Referring to FIG. 1, an air vehicle is illustrated and generally indicated by reference numeral 10. The air vehicle 10 includes a number of equipment bays 12 that house a variety of equipment such as avionics or batteries, and in this particular illustration, a plurality of avionics boards 14 having electronic components that generate heat during operation. Additionally, some or all of the equipment bays 12 may be sealed in order to prevent moisture intrusion during operation, which is described in greater detail below.

The equipment bays 12 are covered by access panels, or hatches, which are not shown for purposes of clarity. The access panels cover the cavities 16 defined by the equipment bays 12 and generally conform to the outer moldline shape of the air vehicle 10, which in this illustrative example are upper wing moldlines. It should be understood that the air vehicle 10 and its configuration of equipment bays 12 is merely exemplary, and thus any number and/or size of equipment bays 12 may be employed in a variety of different types of air vehicles while remaining within the scope of the present disclosure.

Referring now to FIGS. 2 through 5, an exemplary avionics board 14 is illustrated and has at least one heat-generating component 20 disposed thereon, such as a radio frequency power amplifier. In one form, the avionics board 14 and heat-generating component(s) 20 are part of a system 22 for managing heat transfer according to the principles of the present disclosure that is better illustrated in FIG. 5. As shown, the system 22 includes the avionics board 14 and heat-generating components 20 within the cavity 16, which defines an inner wall portion 24. A plurality of heat conducting members 30 are disposed adjacent one another as shown (and also in FIGS. 3 and 4), which are positioned between the heat generating components 20 and the inner wall portion 24 of the cavity 16. The plurality of heat conducting members 30 generally comprise a core 32 and an outer shell 34 wrapped around at least a portion of the core 32. The outer shell 34 comprises a material having a relatively high thermal conductivity, and in one form is at least one sheet of pyrolytic graphite sheet (PGS) material. The cores 32 are thermally conductive, and in one form are a thermally conductive foam. Furthermore, the cores 32 are resilient in one form of the present disclosure, such that the heat conducting members 30 are more capable of withstanding impact loads. As used herein, the term "resilient" should be construed to mean having properties that allow the cores 32 to elastically or plastically deform under load. Additional details of the heat conducting members 30 and variants thereof are set forth in greater detail below.

Figure 3:
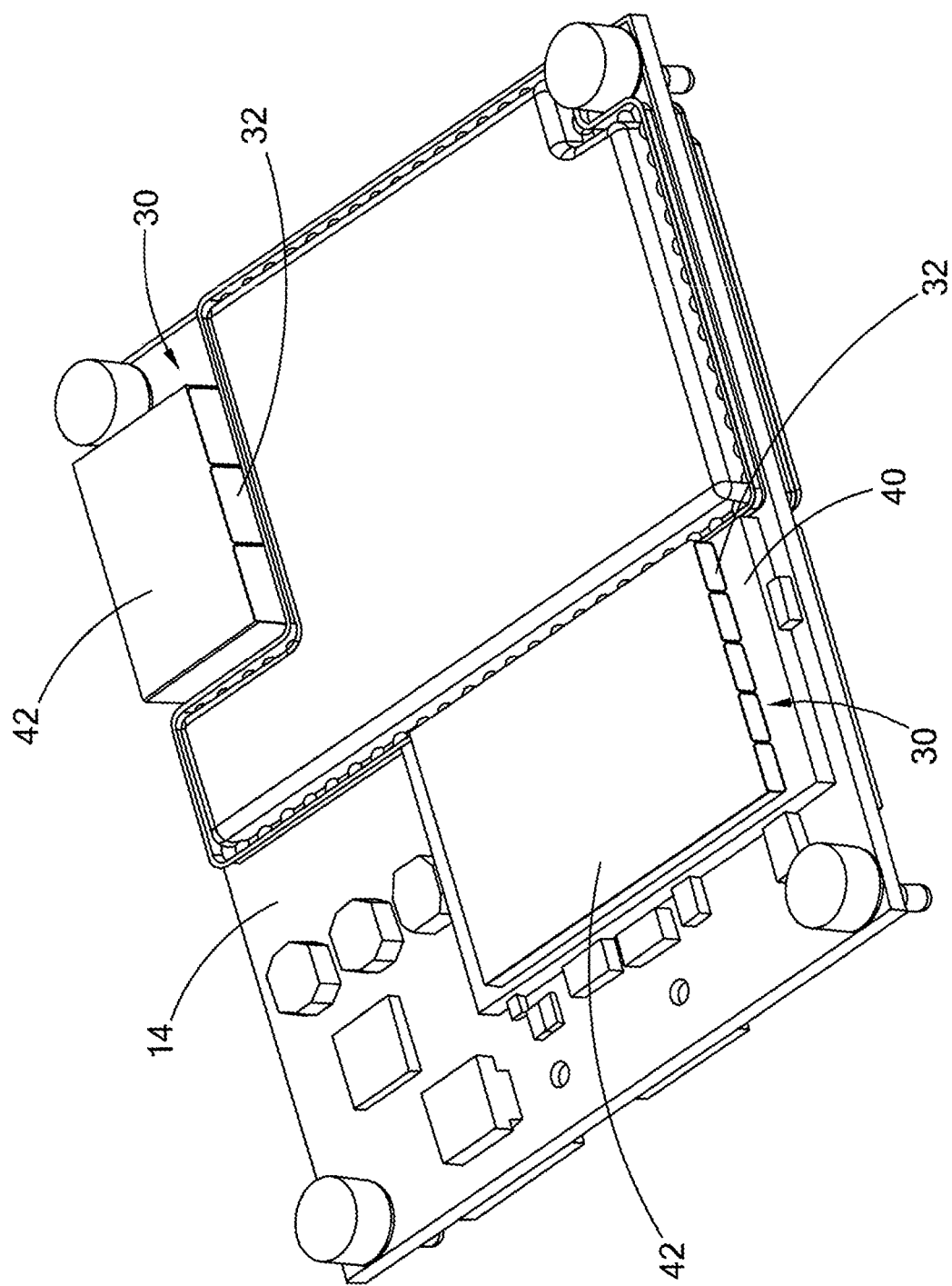
FIG. 3 is a bottom perspective view of the system for managing heat transfer in accordance with the principles of the present disclosure.
Figure 4:
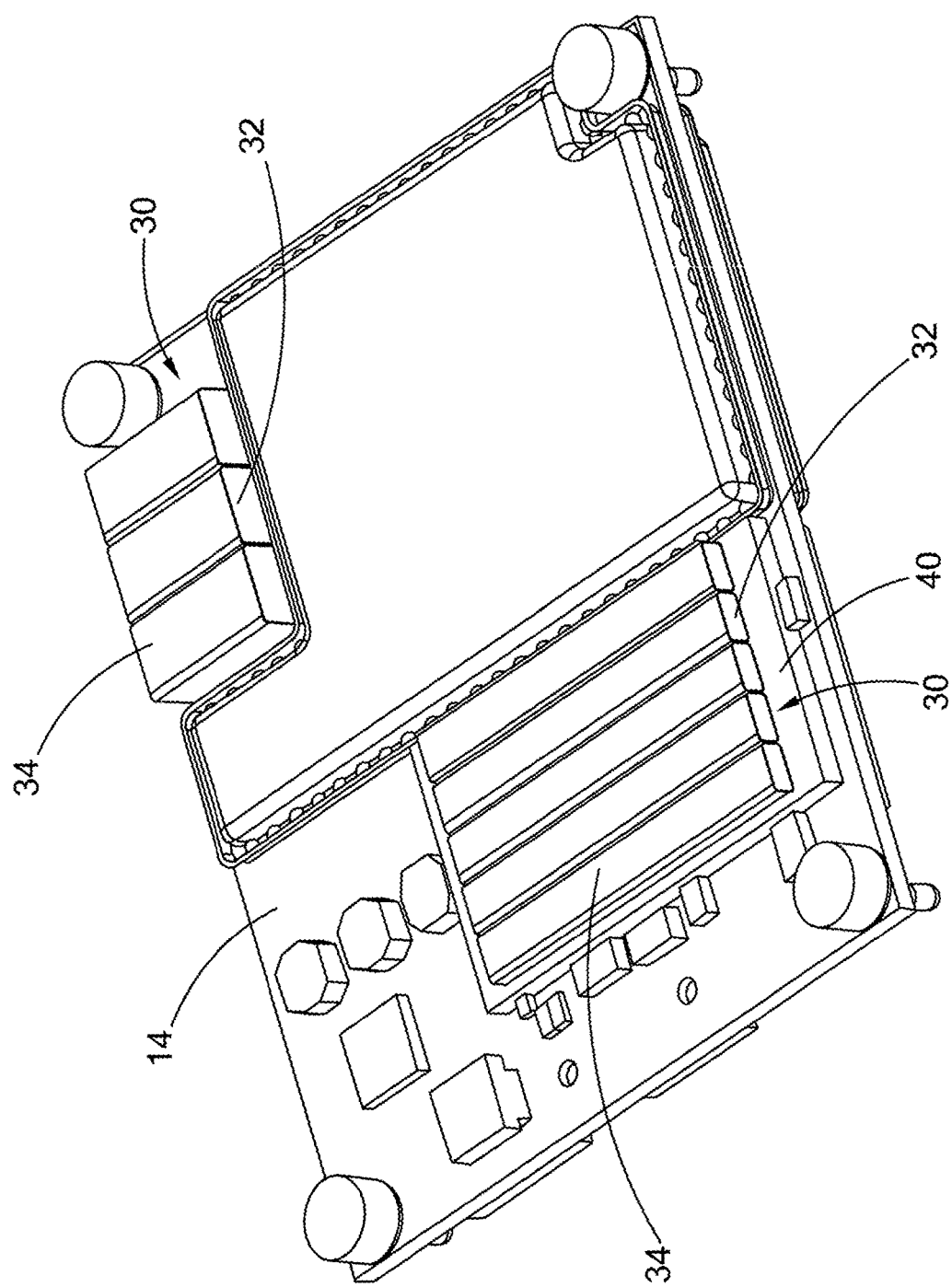
FIG. 4 is another bottom perspective view, with certain components removed for purposes of clarity, of the system for managing heat transfer in accordance with the principles of the present disclosure.
Figure 5:
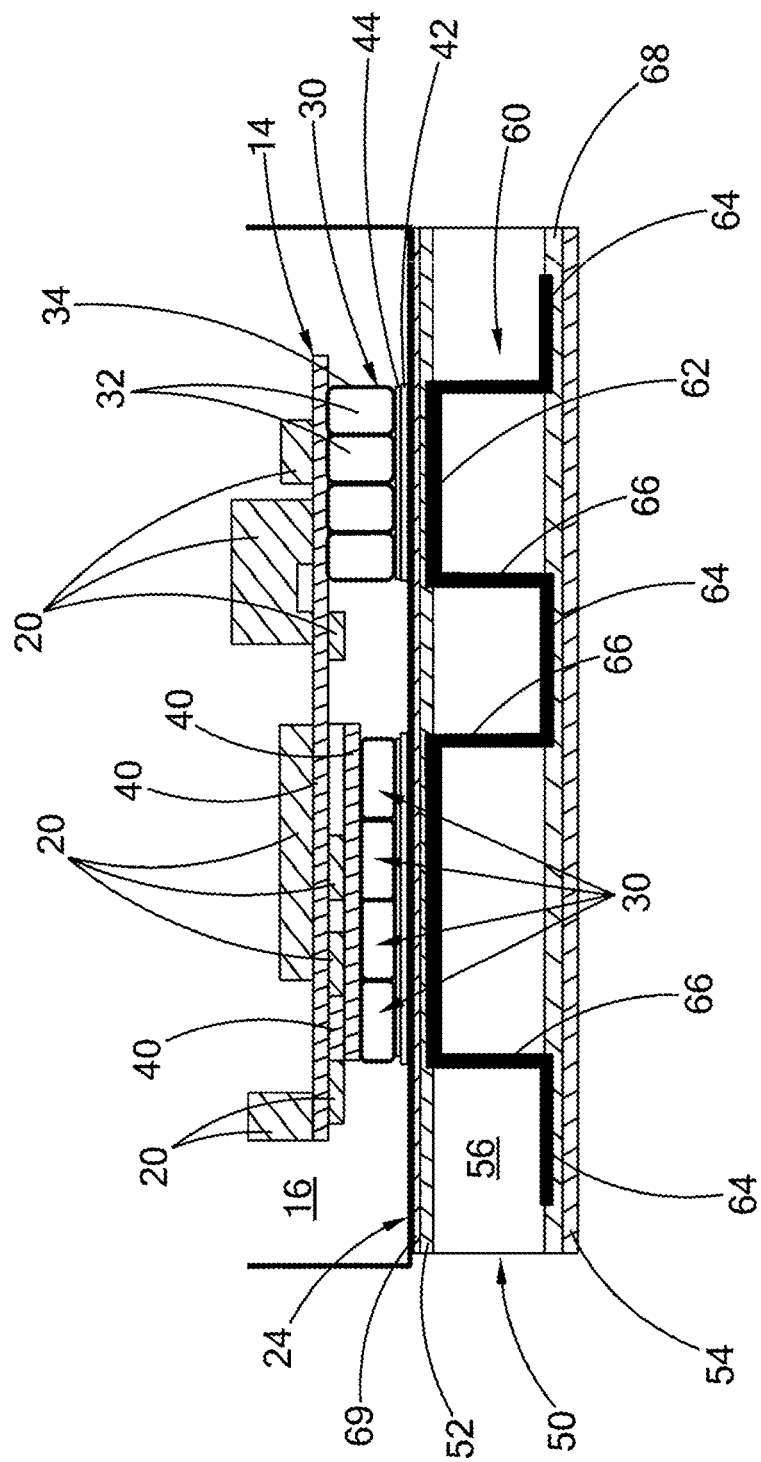
FIG. 5 is an offset cross-sectional view, taken along line 5-5 of FIG. 3, illustrating various components of the system for managing heat transfer in accordance with the principles of the present disclosure.

As further shown in FIG. 5, the system 22 also comprises at least one thermally conductive element 40 disposed between the heat conducting members 30 and the heat generating components 20. In one form, the thermally conductive elements 40 are thermal gap filler pads that have a thermal conductivity of about 5 W/mK. The system 22 also includes a pressure-sensitive adhesive (PSA) layer 42 in contact with the inner wall portion 24 to secure the heat conducting members 30 to the cavity 16. (The PSA layer 42 is also shown in FIG. 3). Alternately, a layer of stiffening material 44 may be disposed over the heat conducting members 30 and next to the PSA layer 42 in order to provide additional stiffness to the plurality of heat conducting members 30. In one form, this stiffening material 44 is a copper material, however, it should be understood that other materials that exhibit both thermal conductivity and an appropriate stiffness may also be employed while remaining within the scope of the present disclosure.

The system 22 also includes a structural member 50 disposed proximate the inner wall portion 24 of the cavity 16, which in this form comprises an upper skin 52, a lower skin 54, and a foam core 56 disposed between the upper skin 52 and the lower skin 54. As shown, at least one heat conducting array 60 extends through the foam core 56 and between the upper skin 52 and the lower skin 54. The heat conducting array 60 is also, in one form, a pyrolytic graphite sheet (PGS) material. The heat conducting array 60, in this form, includes at least one upper cap 62, at least one lower cap 64, and a wall portion 66 extending between the upper cap 62 and the lower cap 64. The caps 62 and 64 may also be understood as flanges or legs that extend away from or between the wall portions 66 as illustrated herein. As shown, the upper caps 62 are disposed proximate a heat source, which in this illustration is the heat-generating components 20 and the elements therebetween. Further details of the heat conducting array 60, and variants thereof, are set forth in greater detail below.

As further shown, an optional heat conducting spreader 68 is disposed between the lower caps 64 of the heat conducting array 60 and the lower skin 54 of the structural member 50, in one form of the present disclosure. Similar to forms of the heat conducting member 30 and the heat conducting array 60, the heat conducting spreader 68 is also a pyrolytic graphite sheet (PGS) material in one form of the present disclosure.

In an alternate form, a moisture-proof layer 69 is disposed over the upper skin 52 in an application where the cavity 16 is to be sealed from moisture intrusion. In this form, the moisture-proof layer 69 is an ethylene-co-methacrylic acid (EMAA) material, although it should be understood that other moisture-proof materials may be employed while remaining within the scope of the present disclosure.

Figure 6:
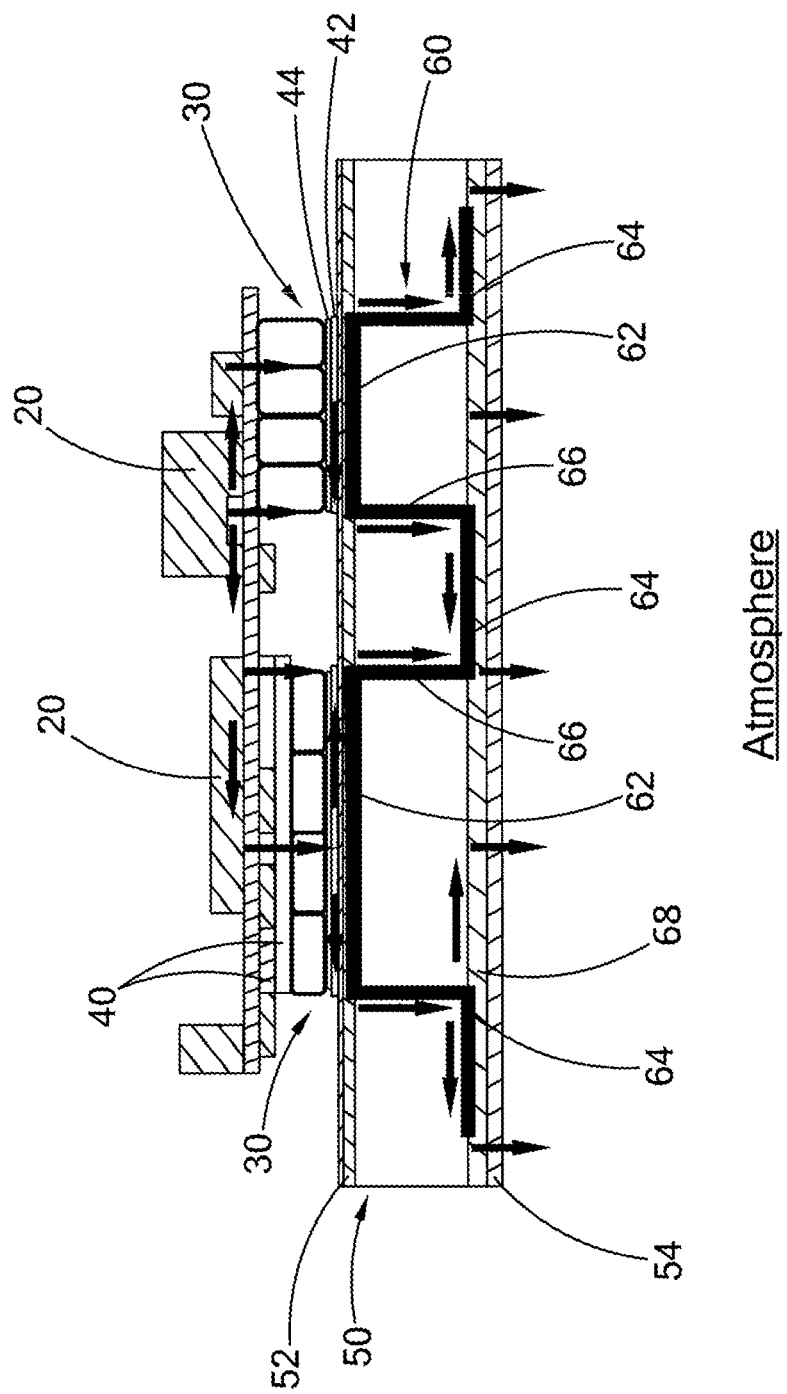
FIG. 6 is the offset cross-sectional view of FIG. 5 illustrating heat flow through the various components, including the heat conducting members, according to the principles of the present disclosure.

Referring now to FIG. 6, the system 22 and its heat transfer characteristics are illustrated and described in greater detail. As indicated by the arrows, in operation, heat that is generated from the components 20 is transferred to the heat conducting members 30 and the thermally conductive elements 40. The heat is then transferred through the PSA layer 42 (and also the stiffening material 44 if present), to the upper skin 52 of the structural member 50. From there, the heat transfers through the upper caps 62 of the heat conducting array 60, then down through the wall portions 66, to the lower caps 64, to the heat conducting spreader 68, and then out to the atmosphere through the lower skin 54. Accordingly, the system 22 provides efficient and effective heat transfer paths in order to dissipate the heat generated by components 20. In preliminary testing, the temperature difference between the heat generating components 20 and the lower skin 54 was reduced by about fourteen percent (14%). In other words, about fourteen percent (14%) of the heat generated by the components 20 did not reach the lower skin 54.

Figure 7:
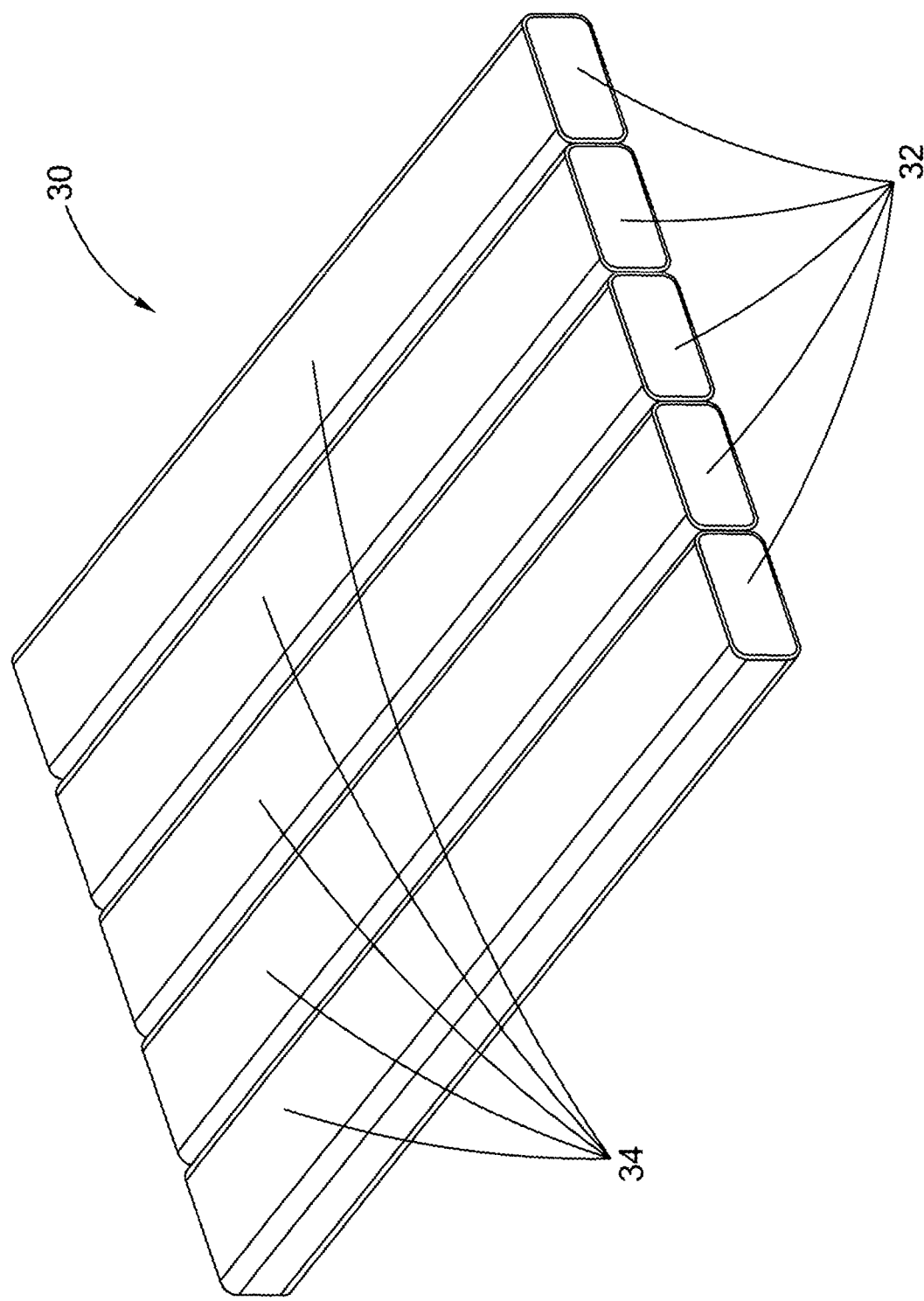
FIG. 7 is a perspective view of a plurality of heat conducting members constructed in accordance with the principles of the present disclosure.

Further details of the heat conducting members 30 are now described with reference to FIGS. 7 and 8. As previously set forth, the heat conducting members 30 include a core 32 and an outer shell 34 wrapped around at least a portion of the core 32. The outer shells 34 of the heat conducting members 30 are in physical contact with each other as shown in FIG. 7 in order to provide improved heat transfer characteristics. In this form, the heat conducting members 30 have a generally rectangular configuration as illustrated. It should be understood that other geometric configurations for the heat conducting members 30, one of which is set forth in greater detail below, are to be construed as falling within the scope of the present disclosure.

Figure 8:
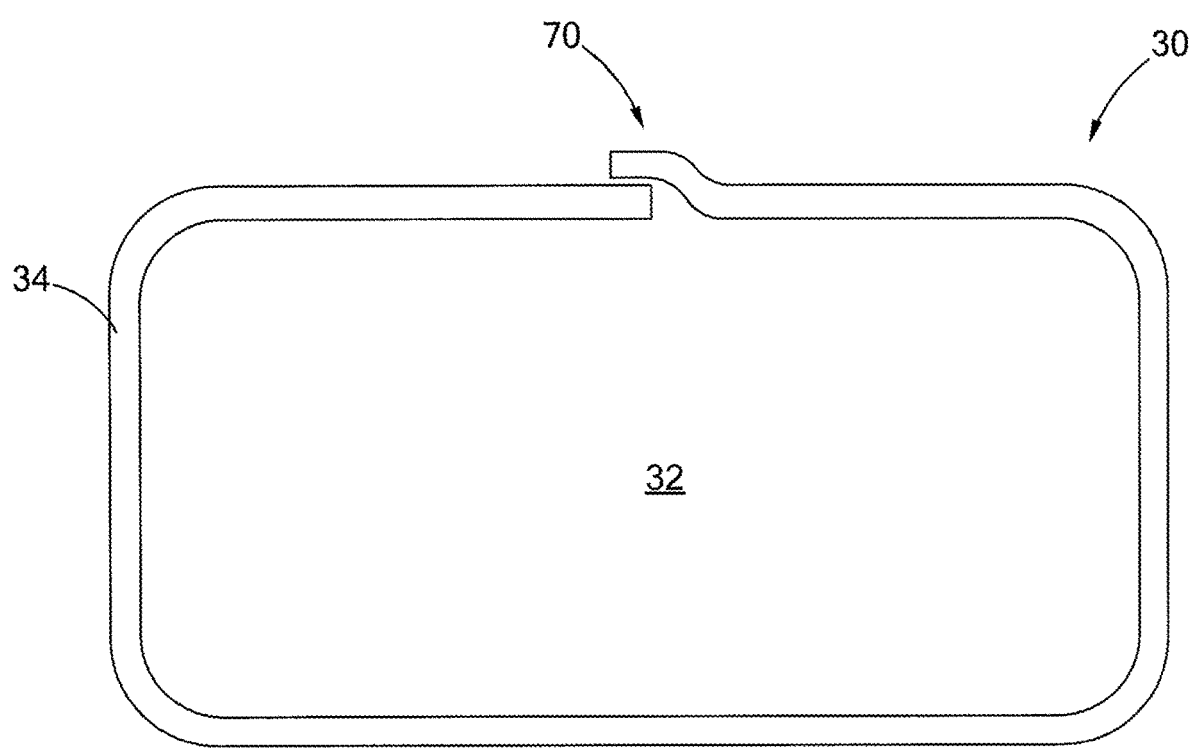
FIG. 8 is an end view of a heat conducting member constructed in accordance with the principles of the present disclosure.

As shown more clearly in FIG. 8, the outer shells 34 of the heat conducting members 30 are wrapped completely around the cores 32. In one form, the outer shells 34 extend around the cores 32 to define an overlap region 70. Accordingly, one end of the outer shell 34 extends over, or overlaps, the other end of the outer shell 34 in order to completely encase the core 32. It should be understood that the outer shells 34 can be configured to be wrapped completely around the cores 32 in other joint configurations, such as a butt or step-lap joint, while remaining within the scope of the present disclosure. Additionally, in some configurations, it is contemplated that the outer shells 34 may be discontinuous or not wrap completely around the cores 32 while remaining within the scope of the present disclosure.

Figure 9:
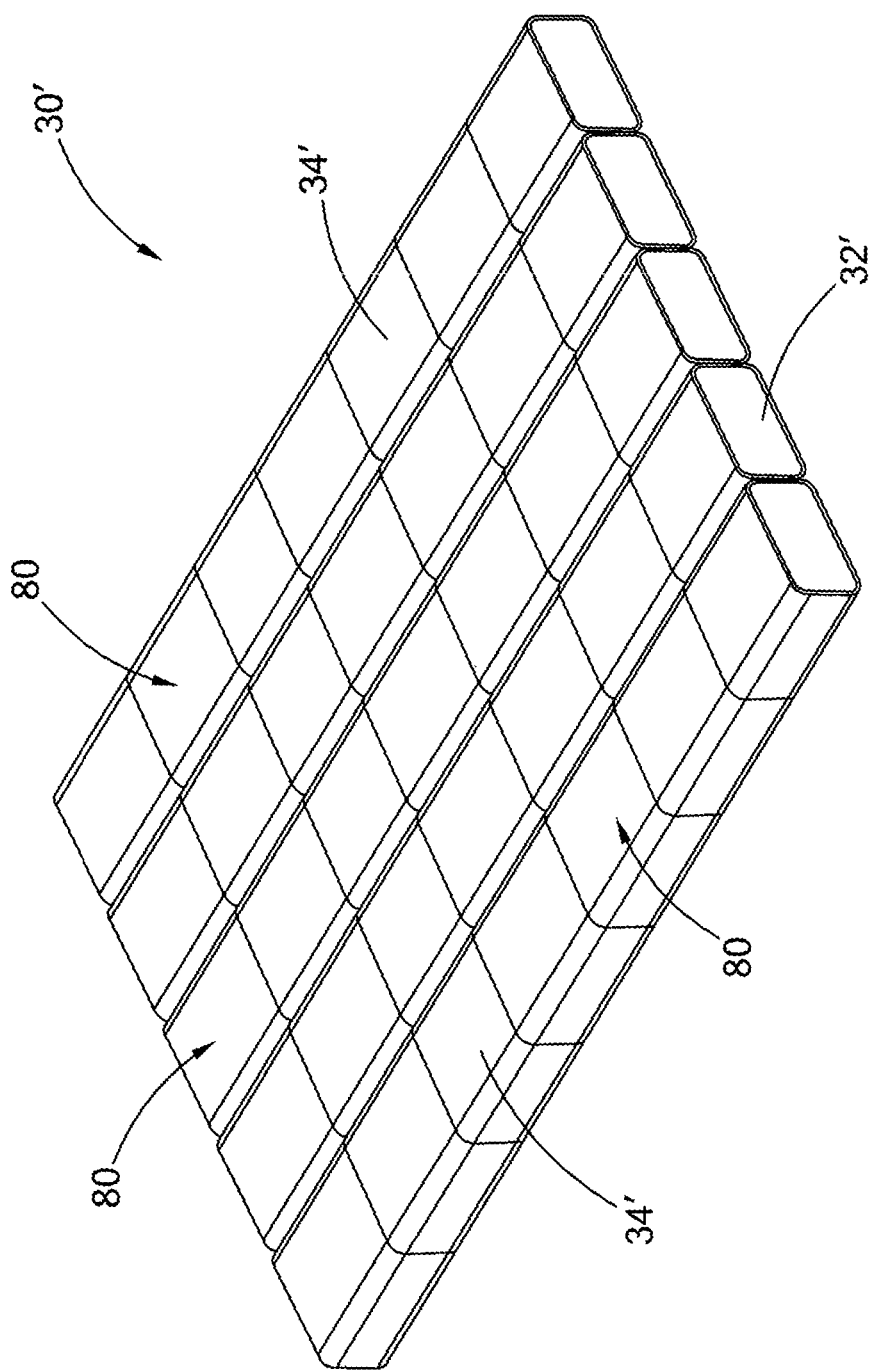
FIG. 9 is a perspective view of an alternate form of the heat conducting members constructed in accordance with the principles of the present disclosure.

Referring now to FIG. 9, another configuration of the heat conducting members is illustrated and generally indicated by reference numeral 30'. In this configuration, the heat conducting members 30' define a grid configuration of individual elements 80, that in one form are in physical contact with one another and that have outer shells 34' that completely encase the cores 32'. It should be understood, however, that other grid configurations having varying geometries for the individual elements 80, and different outer shell configurations as set forth above, shall be construed as falling within the scope of the present disclosure.

Figure 10:
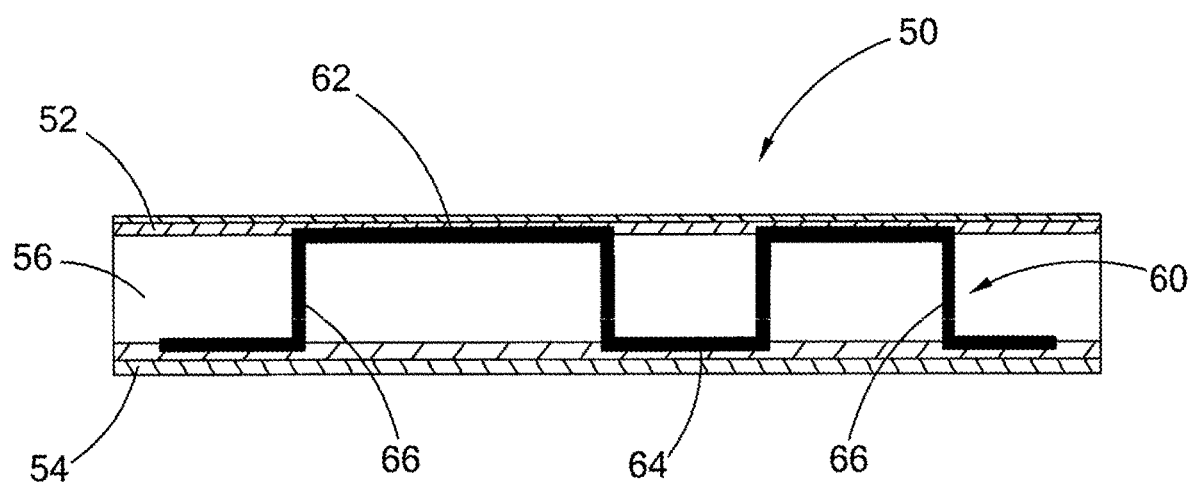
FIG. 10 is an end view of a structural member and heat conducting array constructed in accordance with the principles of the present disclosure.

Referring now to FIG. 10, the structural member 50 and heat conducting array 60 are described in greater detail. As previously set forth, the heat conducting array 60 extends through the foam core 56 and between the upper skin 52 and the lower skin 54 of the structural member. The heat conducting array 60 in one form is a continuous piece, however, it should be understood that the heat conducting array 60 may be discontinuous and/or formed from separate pieces while remaining within the scope of the present disclosure.

The upper skin 52 and lower skin 54 in one form are a Kevlar® material, although it should be understood that other types of fiber-reinforced composites such as carbon-fiber composites or glass-fiber composites may also be employed, in addition to various types of metallic structures. In one form, the foam core 56 comprises a low density, high strength polystyrene foam material, such as Spyderfoam. Additionally, the structural member 50 in this form is an aircraft skin, however, it should be understood that this application is merely exemplary and that other forms of structure such as internal spars or ribs, or structures of other vehicles, buildings, or other devices may be employed while remaining within the scope of the present disclosure.

Figure 11:
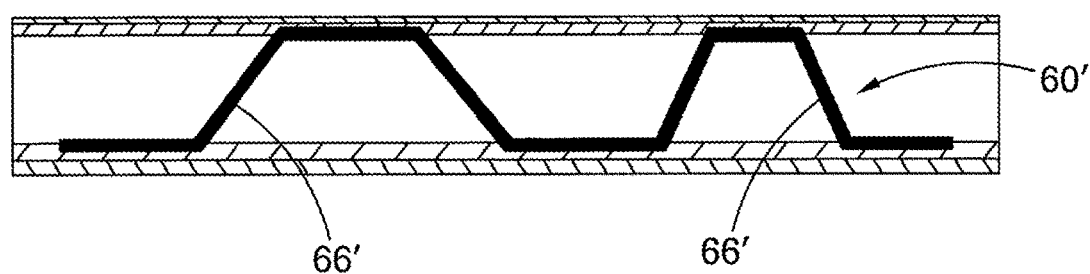
FIG. 11 is an end view of another form of a heat conducting array constructed in accordance with the principles of the present disclosure.

As shown, the wall portions 66 of the heat conducting array 60 extend vertically between the upper caps 62 and the lower caps 64 in one form of the present disclosure. It should be understood, however, that the wall portions 66' may extend at an angle as shown in FIG. 11, creating what is commonly referred to as a "hat" configuration for the heat conducting array 60'. Other variations, including but not limited to "J," "L," or "T" configurations may also be employed according to the heat conducting and structural load requirements of a particular application. Accordingly, it should be understood that a variety of forms of heat conducting arrays 60 may be employed while remaining within the scope of the present disclosure.

Figure 12:
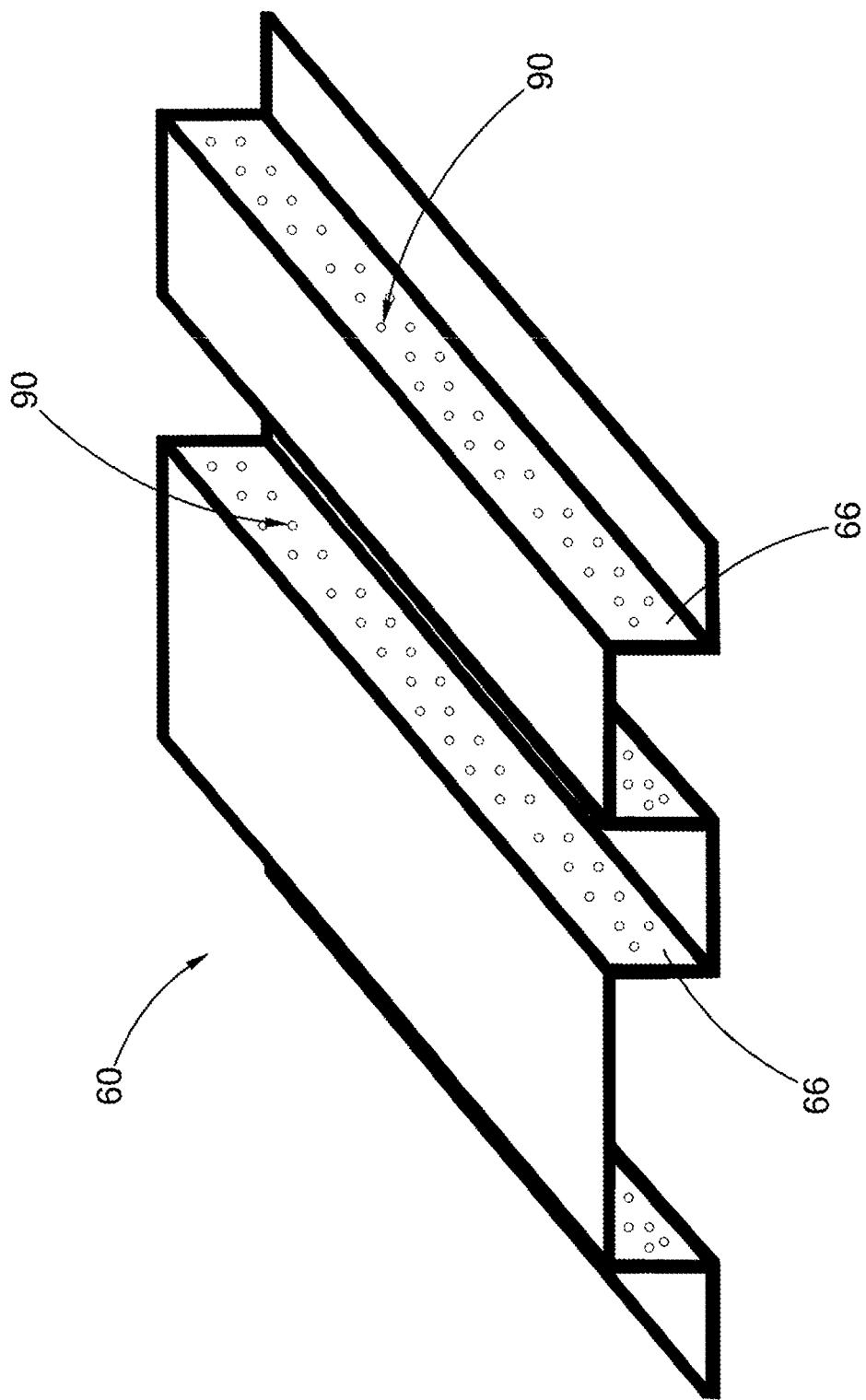
FIG. 12 is a perspective view of a heat conducting array that extends through the structural member and constructed in accordance with the principles of the present disclosure.

Advantageously, as shown in FIG. 12, the wall portions 66 define a plurality of apertures 90, which create openings that allow material of the foam core 56 to migrate through during manufacturing. These apertures 90 provide for improved structural integrity by enhancing the bond between the wall portions 66 and the foam core 56. The manufacture of the structural member 50, and more specifically the heat conducting array 60 and apertures 90, is now described in greater detail.

Figure 13:
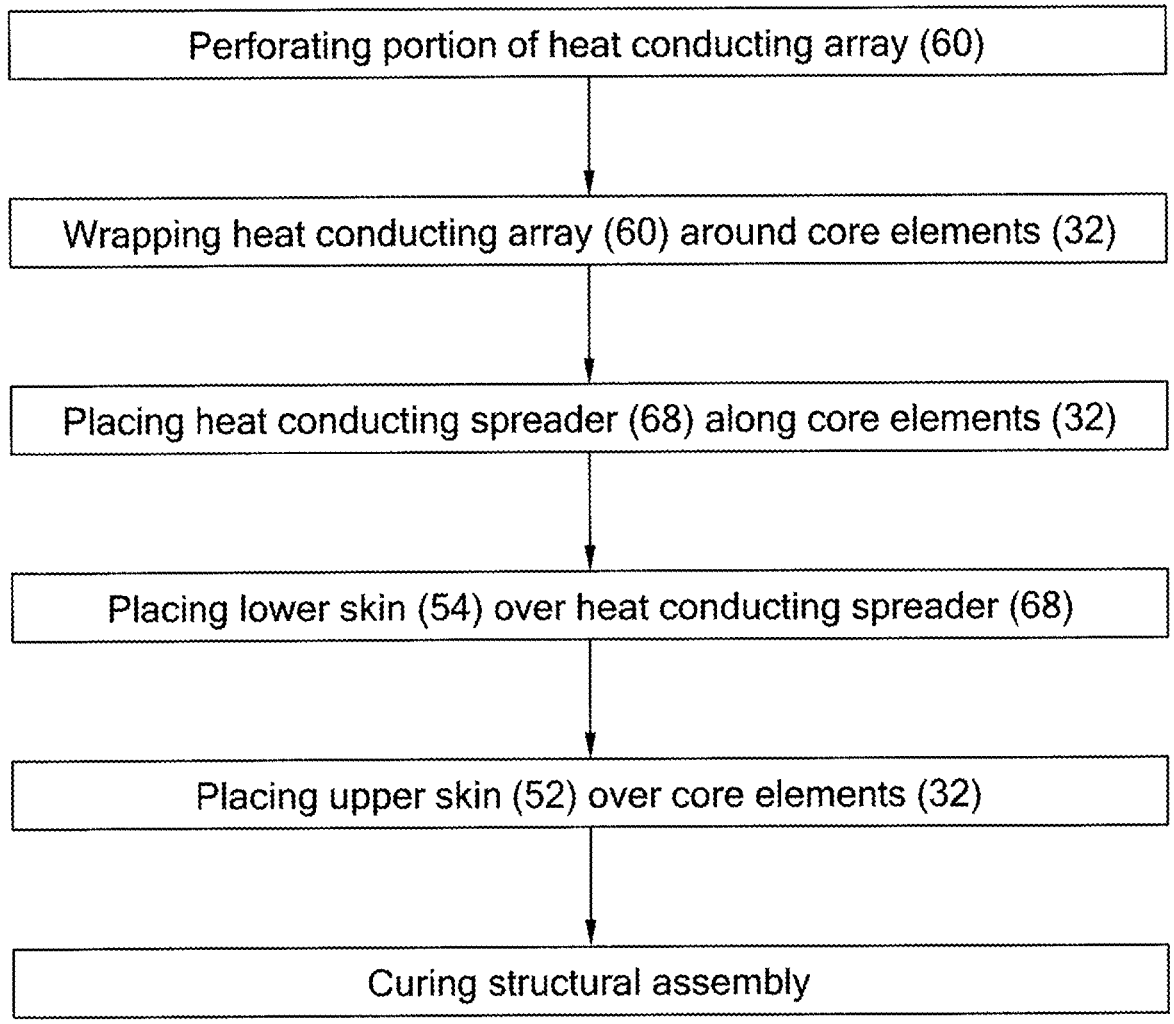
FIG. 13 is a flow diagram illustrating a manufacturing process in accordance with the principles of the present disclosure.

Referring to FIG. 13, the heat conducting array 60 is prepared by perforating at least a portion of the heat conducting array 60, such as the wall portions 66. The heat conducting array 60 is then wrapped around the core elements 32, and the heat conducting spreader 68 is placed along one surface area of the core elements 32. The lower skin 54 is placed over the heat conducting spreader 68, and the upper skin 52 is placed over an opposite surface area of the core elements 32 to create a structural assembly. The structural assembly is then cured, either through a room temperature and standard atmospheric pressure cure or a vacuum autoclave cure, by way of example, wherein a material of the core elements 32 flows through the perforated portions 90 of the heat conducting array 60 during the curing step. As set forth above, this results in an interface between the heat conducting array 60 and the core elements 32 with improved structural integrity.

It should be understood that the order of these manufacturing steps are merely exemplary and that other orders of the steps may be employed, such as placing the upper skin 52 over the heat conducting spreader 68 and the core elements 32 before the lower skin 54, while remaining within the scope of the present disclosure. Additionally, it should be understood that the heat conducting spreader 68 is optional and thus the structural assembly can be formed without this member while remaining within the scope of the present disclosure. Furthermore, the structural assembly may be formed in a press, either heated or non-heated, while remaining within the scope of the present disclosure.

It should be noted that the disclosure is not limited to the various forms described and illustrated as examples. A large variety of modifications have been described and more are part of the knowledge of the person skilled in the art. These and further modifications as well as any replacement by technical equivalents may be added to the description and figures, without leaving the scope of the protection of the disclosure and of the present patent.

We claim:

1. A system for managing heat transfer comprising:
   a heat-generating component; and
   a heat conducting member comprising a resilient core, and an outer shell wrapped around at least a portion of the resilient core, the outer shell comprising a material having a relatively high thermal conductivity, wherein the heat conducting member is positioned between the heat-generating component and an inner wall of an avionic cavity;
   a structural member disposed proximate an opposing side of the inner wall of the avionic cavity, and comprising:
   an upper skin;
   a lower skin; and
   a foam core disposed between the upper skin and the lower skin;
   an undulating heat conducting array extending through the foam core and between the upper skin and the lower skin, the undulating heat conducting array defining a plurality of upper caps, a plurality of lower caps, and a plurality of wall portions, where each wall portion extends between one of the plurality of upper caps and one of the plurality of lower caps that are adjacent to one another, and wherein each wall portion defines a perforated portion,
   wherein the heat conducting array is configured to dissipate heat from the heat-generating component by transferring heat from at least one of the plurality of upper caps, through the wall portion, to its adjacent lower cap, to a lower skin of the structural member, and out to an atmosphere.

2. The system according to claim 1, wherein the lower skin is disposed proximate to the plurality of lower caps.

3. The system according to claim 1, further comprising a circuit board disposed between the heat-generating component and the heat conducting member.

4. The system according to claim 1, wherein there is an open space between a first and a second upper cap of the plurality of upper caps that are adjacent to one another.

5. The system according to claim 4, wherein the first upper cap and the second upper cap that are adjacent to one another are spaced apart from one another.

6. The system according to claim 1, wherein a surface area of each of the plurality of upper caps is not equal to a surface area of each of the plurality of lower caps.

7. The system according to claim 1, wherein a surface area of each of the plurality of upper caps is equal to a surface area of each of the plurality of lower caps.

8. The system according to claim 1, wherein the wall portion, that extends between an upper cap from the plurality of upper caps that is adjacent to a lower cap from the plurality of lower caps, is positioned at an incline.

9. The system according to claim 1 wherein the resilient core is thermally conductive.

10. The system according to claim 1, wherein the resilient core comprises thermally conductive foam.

11. The system according to claim 1, wherein the resilient core is configured to deform under load.

12. The system according to claim 1, wherein the outer shell is wrapped completely around the resilient core.

13. The system according to claim 1, wherein the outer shell is not wrapped completely around the resilient core.

14. The system according to claim 1, wherein the structural member comprises an aircraft skin.

15. The system according to claim 1, wherein the foam core is configured to flow through the perforated portion of the wall portions during forming of the structural member.

* * * * *